(12) United States Patent
Gibson et al.

(10) Patent No.: US 7,566,122 B2
(45) Date of Patent: *Jul. 28, 2009

(54) FLUID EJECTION DEVICE UTILIZING A ONE-PART EPOXY ADHESIVE

(75) Inventors: Lawrence E Gibson, San Diego, CA (US); Daniel T. Pogany, Cuyahoga Falls, OH (US); Hsin-Chieh Chou, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 805 days.

This patent is subject to a terminal disclaimer.

(21) Appl. No.: 10/825,840

(22) Filed: Apr. 15, 2004

(65) Prior Publication Data
US 2005/0231551 A1   Oct. 20, 2005

(51) Int. Cl.
*B41J 2/18* (2006.01)
(52) U.S. Cl. .................... 347/91; 428/34.1; 428/355 R; 428/355 EP
(58) Field of Classification Search ............ 347/91, 347/87; 428/34.1, 355 R, 355 EP
See application file for complete search history.

(56) References Cited

U.S. PATENT DOCUMENTS

| | | | | |
|---|---|---|---|---|
| 3,336,241 A * | 8/1967 | Sbokal | ................ | 525/507 |
| 3,860,541 A * | 1/1975 | Lehmann et al. | ............ | 525/523 |
| 3,874,493 A * | 4/1975 | Boyd | .................... | 400/120.14 |
| 4,117,038 A * | 9/1978 | Lehmann et al. | .............. | 525/65 |
| 4,120,913 A * | 10/1978 | Petrie | ......................... | 525/524 |
| 4,291,144 A * | 9/1981 | Takago | ....................... | 528/26 |
| 4,728,384 A * | 3/1988 | Goel | ...................... | 156/307.3 |
| 4,866,133 A * | 9/1989 | Andrews et al. | ........... | 525/109 |
| 5,013,383 A * | 5/1991 | Chapman | ................. | 156/307.3 |
| 6,019,457 A * | 2/2000 | Silverbrook | ................. | 347/65 |
| 6,045,215 A * | 4/2000 | Coulman | ..................... | 347/47 |
| 6,130,695 A * | 10/2000 | Childers et al. | ............... | 347/85 |
| 6,299,272 B1 * | 10/2001 | Baker et al. | ................... | 347/10 |
| 6,325,491 B1 * | 12/2001 | Feinn | ......................... | 347/50 |
| 6,787,049 B2 * | 9/2004 | Tom et al. | ..................... | 216/27 |
| 7,003,418 B2 * | 2/2006 | Bonne et al. | ................ | 702/100 |

* cited by examiner

*Primary Examiner*—Michael C Miggins

(57) ABSTRACT

A fluid ejection device, including a substrate carrier having a substrate receiving-surface, and a substrate having at least one fluid ejector actuator disposed on the substrate. In addition the fluid ejection device includes a one-part adhesive disposed between the substrate and the substrate-receiving-surface. The one-part adhesive is an epoxy resin having a polyglycidyl ether of a polyhydric phenol, a solid cylcoaliphatic amine curing agent.

39 Claims, 3 Drawing Sheets

FLUID EJECTION DEVICE UTILIZING A ONE-PART EPOXY ADHESIVE

BACKGROUND

Description of the Art

Substantial developments have been made in the micromanipulation of fluids in fields such as electronic printing technology using inkjet printers. However, as the number and complexity of fluids manipulated or ejected increases, the susceptibility of the microfluidic device to degradation by components in those fluids may also increase. In addition, pressure to reduce weight and cost, and to increase manufacturing volume places additional limitations or restrictions on both the processes and the materials that may be utilized. Fluid ejection devices and fluid supplies provide a good example of the problems facing the practitioner in increasing the reliability and robustness these microfluidic devices.

Currently there is a wide variety of highly efficient inkjet printing systems in use, which are capable of dispensing ink in a rapid and accurate manner. However, there is a demand by consumers for ever-increasing improvements in speed and image quality. In addition, there is also increasing demand by consumers for longer lasting fluid ejection cartridges. One way to increase the speed of printing is to move the print or fluid ejection cartridge faster across the print medium. However, if the fluid ejection cartridge includes both the fluid reservoir and the energy generating elements then a longer lasting print cartridge typically would require a larger ink reservoir, with the corresponding increase in mass associated with the additional ink. This increase in mass requires more costly and complex mechanisms to move the print cartridge at even higher speeds to produce the increased printing speed. Color printers, typically, utilize a black ink cartridge and 3 color cartridges resulting in a further increase in mass, the four cartridges requiring four larger ink reservoirs also to be moved at a higher speed further exacerbates the weight problem.

Thus, in an effort to reduce the cost and size of ink jet printers and to reduce the cost per printed page, printers have been developed having small, moving printheads that are connected to large stationary ink supplies. This development is generally referred to as "off-axis" printing, and has allowed large ink supplies to be replaced as they are consumed without requiring the frequent replacement of the costly printheads containing the fluid ejectors and nozzle system. Such a system, however, places additional reliability burdens on the printhead.

In addition, improvements in image quality have led to an increase in the complexity of ink formulations that increases the sensitivity of the ink to the ink supply and print cartridge materials that come in contact with the ink. Degradation of these materials by more corrosive inks raises reliability and material compatibility issues. Typically, these improvements in image quality have led to an increase in the organic content of inkjet inks that results in a more corrosive environment experienced by the materials utilized thus raising material compatibility issues. These material compatibility issues generally relate to all the materials the ink comes in contact with. However, they are exacerbated in the printhead because, in an off-axis system, the materials around the fluid ejectors and nozzles need to maintain their functionality over a longer period of time. Without such an increased reliability the printhead will not be able to continue functioning properly through at least several replacements of the stationary ink supplies. Thus, degradation of these materials can lead to potentially catastrophic failures of the printhead.

In order to reduce both weight and cost many of the materials currently utilized are made from polymers such as plastics and elastomers. Many of these plastic materials, typically, utilize various additives, such as stabilizers, plasticizers, tackifiers, polymerization catalysts, and curing agents. These low molecular weight additives are typically added to improve various processes involved in the manufacture of the polymer and to reduce cost without severely impacting the material properties.

The interaction of these low molecular weight additives and the components of the ink may give rise to a weakening of an adhesive joint or a polymer film interface. Failure of an adhesive joint or delamination of the polymer film may lead to ink penetrating to regions where active circuitry is located leading to the potential for either corrosion or electrical shorting, or both, all of which can be potentially fatal to the operation of the printhead. Since these additives, typically, are low in molecular weight compared to the molecular weight of the polymer, they can leach out of the polymer by the ink, react with ink components, or both, more easily than the polymer itself causing such problems. In either case, the reaction between these low molecular weight additives and ink components can also lead to the formation of precipitates or gelatinous materials, which can further result in degraded print or image quality. In addition, in a high humidity or moisture environment the retention of the chemical and physical properties of such polymeric material can also be a problem. All of these problems can impact the manufacture of lower cost, smaller, and more reliable printers.

If these problems persist, the continued growth and advancements in inkjet printing and other micro-fluidic devices, seen over the past decade, will be reduced. Consumer demand for cheaper, smaller, more reliable, higher performance devices constantly puts pressure on improving and developing cheaper, and more reliable manufacturing materials and processes. The ability to optimize fluid ejection systems will open up a wide variety of applications that are currently either impractical or are not cost effective.

DESCRIPTION OF THE PREFERRED EMBODIMENTS

Figure 1:
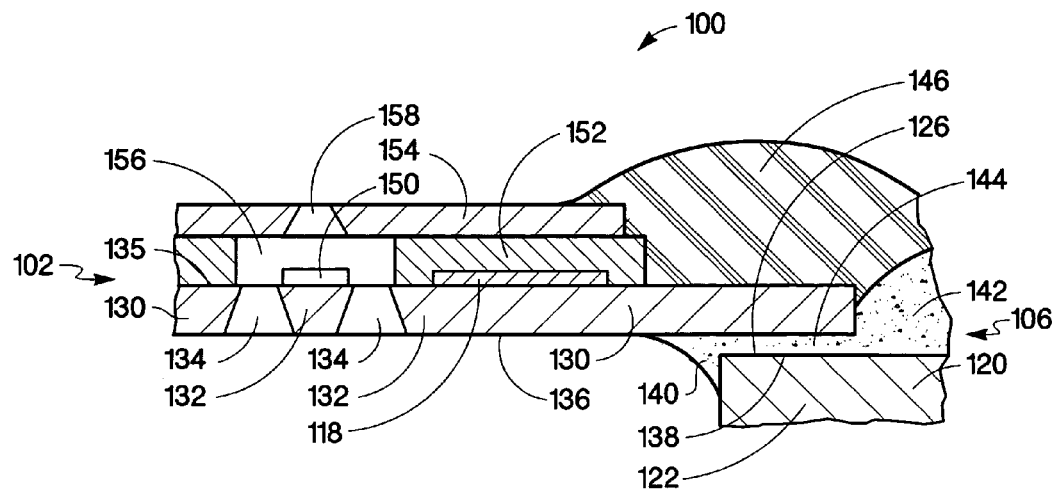
FIG. 1 is a cross-sectional view of a portion of a fluid ejector head according to an embodiment of the present invention.

An embodiment of the present invention is shown, in a cross-sectional view, in FIG. 1. In this embodiment, fluid ejection cartridge 100 includes fluid ejector head 102 mounted to fluid ejection cartridge body 122 via substrate 132 utilizing one-part epoxy adhesive 140. One-part epoxy adhesive 140, in this embodiment, is a thermally cured epoxy. Adhesive bead 142 provides a method of attachment between first adherend 120, the cartridge body, and second adherend 130, the substrate. One-part epoxy adhesive 140 forms bonded structure 106 having adhesive thickness 144 between opposing surface 136 of second adherend 130 and substrate receiving-surface 138 of first adherend 120. Cartridge body 122 includes substrate carrier portion 126, which includes substrate receiving-surface 138. In addition, adhesive bead 142 also provides a fluid seal between substrate 132 and cartridge body 122.

Adhesive thickness 144 is in the range from about 200 micrometers to about 800 micrometers, in this embodiment. However, in alternate embodiments, adhesive thickness 144 may be in the range from about 10 micrometers to 1000 micrometers depending on the particular application in which fluid ejection cartridge 100 will be utilized. Further, in this embodiment, adhesive bead 142 is dispensed on cartridge body 120, however, depending on the particular pen body material utilized, as well as the particular one-part epoxy adhesive used, adhesive bead 142 may be dispensed on substrate 132 in alternate embodiments.

It should be noted that the drawings are not true to scale. Further, various elements have not been drawn to scale. Certain dimensions have been exaggerated in relation to other dimensions in order to provide a clearer illustration and understanding of the present invention.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by various embodiments, it is not intended that these illustrations be a limitation on the scope or applicability of the present invention. Further it is not intended that the embodiments of the present invention be limited to the physical structures illustrated. These structures are included to demonstrate the utility and application of the present invention to presently preferred embodiments.

In this embodiment, substrate 132 has fluid ejector actuator 150 formed on device surface 135. Substrate 132, in this embodiment, is a silicon integrated circuit including transistors and other logic devices. Substrate 132 is a crystalline silicon substrate having a thickness of about 300-800 micrometers. However, in alternate embodiments, materials such as various glasses, ceramic such as aluminum oxide, boron nitride, silicon carbide, sapphire, semiconductors such as gallium arsenide, indium phosphide, germanium, polysilicon, various polymers such as polyimides, and polycarbonates also may be utilized. The transistors, other logic devices, electronic components, and electrical circuits are formed on device surface 135. Active devices 118 are represented as only a single layer in FIG. 1 on device surface 135 to simplify the drawing. Those skilled in the art will appreciate that active devices 118 may be realized as a stack of thin film layers. In alternate embodiments, "direct drive" structures also may be utilized. In a direct drive application each fluid ejector actuator is electrically connected to a bond pad (not shown). In direct drive applications, substrate 132 may be formed from any material suitable for forming fluid ejector actuator 150 such as, for example, glass, ceramic, or polymer substrates.

Accordingly, the present invention is not intended to be limited to those devices fabricated in silicon semiconductor materials, but will include those devices fabricated in one or more of the available semiconductor materials and technologies known in the art, such as thin-film-transistor (TFT) technology using polysilicon on glass substrates. Further, substrate 132 is not restricted to typical wafer sizes, and may include processing a polymer sheet or film or glass sheet or even a single crystal sheet or a substrate handled in a different form and size than that of conventional wafers or substrates. The actual substrate material utilized will depend on various parameters such as the particular fluid ejector actuator utilized, the particular fluid being ejected, the size and number of fluid ejector actuators utilized in the particular fluid ejector head, and the environment to which the fluid ejector head will be subjected.

As shown in FIG. 1, fluid ejector actuator 150 may be any device capable of imparting sufficient energy to the fluid to cause ejection of fluid from chamber 156 such as compressed air actuators, electro-mechanical actuators, or thermal mechanical actuators. Fluid definition layer 152 forms fluidic chamber 156 around fluid ejector actuator 150, so that when fluid ejector actuator 150 is activated, fluid is ejected out of bore 158, which is generally located proximate to fluid ejector actuator 150. Fluid channels 134 formed in substrate 132 provide a fluidic path for fluid in a reservoir (See FIG. 3) to fill fluidic chamber 156. Orifice layer 154 is formed over fluid definition layer 152. Orifice layer 154 may be formed of metal, polymer, glass, or other suitable material such as ceramic. For example, a photodefinable polymer such as photodefinable polyimides, benzocyclobutenes, or epoxies can be utilized to form both orifice layer 154 and fluid definition layer 152. In addition, in still other embodiments, orifice layer 154 also may be formed from a metal such as a nickel base enclosed by a thin gold, palladium, tantalum, or rhodium layer. Further, in this embodiment, encapsulant 146 may also utilize a one-part epoxy of the present invention or other polymeric material providing mechanical support, as well as, moisture and corrosion protection to electrical interconnections, bond pads, and electrical traces between cartridge body 122 and substrate 132.

Figure 2:
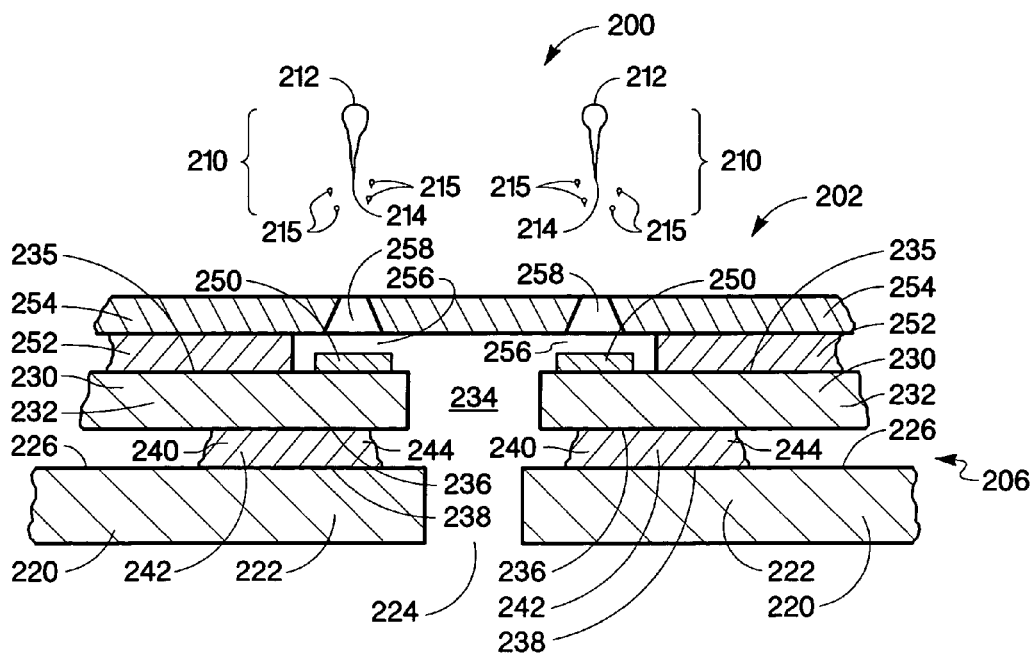
FIG. 2 is a cross-sectional view of a portion of a fluid ejector head according to an alternate embodiment of the present invention.

One-part epoxy adhesive 140 includes a polyglycidyl ether of a polyhyrdric phenol, and a hardener including a solid modified cycloaliphatic amine. Examples of polyepoxides that may be utilized in the present invention are those that are based upon phenols, aliphatic polyols and mixtures thereof. Representative phenolic polyepoxides include polyglycidyl ethers of polyhydric phenols derived from a polyhydric phenol and epihalohydrin. Epihalohydrins used in preparing the polyepoxides may include epichlorohyrdrin and epibromohyrdrin. Haloepoxyalkanes may also be utilized to form epoxy polymers containing epoxyalkoxy groups. Examples of haloepoxyalkanes that may also be utilized are, 1-chloro-2,3-epoxybutane, 1-chloro-2-methyl-2,3-epoxypropane, 1-bromo-2,3-epoxypentane, and 1-chloro-2,3-epoxyoctane. Polyhydric phenols include di(4-dihyrdoxyphenyl)methane, commonly referred to as bisphenol F, and di(4-dihyrdoxyphenyl)propane, commonly referred to as bisphenol A as well as resorcinol. In addition mixtures of bisphenol F diglycidyl ether with epoxy novolacs as well as multifunctional epoxy resins. The resulting polyepoxides generally have an epoxide equivalent weight ranging from about 156 to about 356 for bisphenol A and F epoxies and from about 120 to about 470 for other epoxies. The particular value utilized will depend on the particular application in which fluid ejection cartridge 200, such as shown in FIG. 2, will be used. An epoxide equivalent weight ranging from about 160 to about 180 may be utilized, in this embodiment. In this embodiment, the resin comprises from about 68 weight percent to about 75.5 weight percent of the total weight of the adhesive. However, in alternate embodiments, the resin may range from about 60 weight percent to about 88 weight percent depending on the particular application in which the fluid ejection cartridge is utilized and assuming resin materials with similar equivalent weights as described above are utilized.

In this embodiment, the epoxy resin is a polyglycidyl ether of a polyhyrdric phenol utilizing bisphenol F as the polyhydric phenol. An example of a commercially available resin material that may be utilized is sold by Huntsman, under the name Araldite GY 285 a 100 weight percent Bisphenol F diglycidyl ether. Other examples of commercially available resin materials that also may be utilized include Epon 862 sold by Resolution Performance Products, and DER 354 and DER 354LV sold by Dow Chemical Inc. Another example of a commercially available bisphenol F that may be utilized in the present invention is a low ionic content resin sold by Dainippon Ink and Chemicals Inc. under the name EXA-830LVP. In alternate embodiments, the resin may include a bisphenol A type epoxy resin, epoxy novolac resin, an epoxy phenolic novolac resin, a cresol glycidyl ether, a 1,4 cyclohexanedimenthanol digycidyl ether an aliphatic glycidyl ether having C8 to C18 alkyl groups, an alkyl gylcidyl ether having C4 to C12 alkyl groups, a polypropylene glycol based resin, a 1,4-butanediol diglycidyl ether, triglycidylether of trimethylolpropane, 4-glycidoxy-N,N-diglycidyl aniline, halogenated phenoxy epoxy resins, epoxyalkoxy resins, and mixtures thereof. The particular resin and epoxide equivalent weight utilized will depend on various parameters such as the expected cartridge life, the particular fluid being ejected, and the particular material utilized for the cartridge body.

The primary hardener, in this embodiment, is a solid cycloaliphatic polyamine that is commercially available and sold by Air Products Inc. under the name Ancamine 2442. However, in alternate embodiments, any solid cycloaliphatic amine, such as the latent amines sold by Air Products under the names Ancamine 2441, Ancamine 2014FG, and Ancamine 2337S as well as materials such as dicyandiamide, also known as cyanoguanidine, sold under the name Amicure CG-1400 by Air Products. In still other embodiments, poly (oxypropylene diamine), poly(oxypropylene triamine), polyglycolamine, m-phenylene diamine, 4,4'-diaminodiphenyl sulfone, 4,4'-diaminodiphenyl methane, N-aminoethylpiperazine, 1,2-diaminocyclohexane, 1,3-diaminocyclohexane, 1,4-diamino-3,6-diethylcyclohexane, 2,2-di(4-aminocyclohexyl)propane, di(4-aminocyclohexyl)methane, boron trifluoride monoethylamine, boron trifluoride benzylamine, other boron trifluoride amine complexes, hexahydrophthalic anhydride, polyazelaic polyanhydride, polyadipic polyanhydride, polysebacic polyanhydride, succinic anhydride, tetrahydrophthalic anhydride and other low melting anhydride and polyanhydrides, and mixtures thereof also may be utilized depending on the particular application in which the fluid ejection cartridge will be utilized. In this embodiment, the polyamine curing agent is generally present in the range from about 14 parts per hundred of the epoxy resin (PHR) to about 15 PHR, or as a percentage from about 10 weight percent to about 11 weight percent of the total weight of adhesive. However, in alternate embodiments, the cycloaliphatic amine curing agent may range from about 1 weight percent to about 18 weight percent with similar equivalent weight epoxy resin.

In alternate embodiments, one-part epoxy adhesive 140 also may include an aromatic amine as a secondary cure agent. In still other embodiments, other secondary cure agents also may be utilized. For example, cycloaliphatic amines, phenalkamines, poly(oxypropylenediamanines, diethylenetriamine, triethylenetetramine, poly(oxypropylene diamine), poly(oxypropylene triamine), polyglycolamine, m-phenylene diamine, 4,4'-diaminodiphenyl sulfone, 4,4'-diaminodiphenyl methane, N-aminoethylpiperazine, 1,2-diaminocyclohexane, 1,3-diaminocyclohexane, 1,4-diamino-3,6-diethylcyclohexane, 2,2-di(4-aminocylcohexyl)propane, di(4-aminocyclohexyl)methane, and mixtures thereof also may be utilized to replace a portion of or all of the aromatic amine utilized as a secondary cure agent depending on the particular application in which the fluid ejection cartridge will be utilized. The particular secondary amine utilized will effect the wetting, the adhesion to various substrates, and the fluid resistance to various fluids to which one-part epoxy adhesive 140 may be exposed. In this embodiment, the secondary curing agent is generally present in the range from about 7 to about 8 PHR, or as a percentage from about 5 weight percent to about 6 weight percent of the total weight of adhesive. However, in alternate embodiments, the cycloaliphatic amine curing agent may range from about 0.1 PHR to about 14 PHR or as a percentage from about 0.1 weight percent to about 10 weight percent with similar equivalent weight epoxy resin.

The adhesive composition of the present invention may also contain a thixotrope or thickening agent. In this embodiment, a treated fumed silica is utilized. However, any fumed silica (e.g. treated or untreated), as well as clays, nanoclays, talcs, calcium carbonates, and mixtures thereof may also be utilized in alternate embodiments. Any thixotrope that provides the desired rheology for dispensing the adhesive may be utilized. In this embodiment, the adhesive includes a treated fumed silica sold by Cabot Inc. under the name Cab-O-Sil TS 720. Examples of alternate thixotropic agents that may be utilized in the present invention include fumed silica sold by Cabot under the names Cab-O-Sil TS-530, Cab-O-Sil PTG, fumed silica sold by Degussa under the name Aerosil R805 or R202, fumed silica sold by W R Grace under the name Syloid 244; clay sold by Engelhard under the name Attagel 50, and a nanoclay sold by Nanocor under the name Nanomer nanoclay. The amount of the thixotrope utilized in the present invention depends on the particular use in which the adhesive will be utilized. For example, an adhesive of the present invention applied as a moat-fill type adhesive does not utilize a thickener thereby providing the desired flow and leveling properties for that particular application. Another example is an adhesive applied as a bead such as for structural and encapsulation applications utilizes a thickener in the range from about 6.5 PHR to about 9.5 PHR. Generally a small change in the amount of thickener utilized results in a large change in viscosity, therefore generally the amount of thickener utilized in the present invention is less than 7 weight percent of the totalweight of adhesive.

The adhesive composition of the present invention also may contain a filler to reduce the coefficient of thermal expansion (CTE). In this embodiment, low density glass spheres are utilized; however, in alternate embodiments, other materials also may be utilized as a filler, such as glass spheres, ceramic spheres, polymer spheres, barium sulfate, barium titanate, silicon oxide powder, amorphous silica, talc, clay, mica powder, and mixtures thereof. In this embodiment, medium density hollow glass spheres sold by Potters Inc. under the name Sphericel 110P8 are utilized. In alternate embodiments, other fillers also may be utilized such as sold by 3M Inc. under the name Z-Light Spheres, or fillers sold by PQ Corporation under the name Extendoshperes. In this embodiment, the glass spheres are generally present in the range from about 7 PHR to about 10 PHR or as a percentage from about 5.5 weight percent to about 7.5 weight percent of the total weight of adhesive. In still other embodiments, the glass spheres may be in the range from about 4 PHR to about 20 PHR or as a percentage from 3 weight percent to about from 10 weight percent of the total weight of adhesive. The amount of filler utilized will depend on various parameters such as the CTE desired, the particular cartridge body material utilized, and the amounts of other materials utilized in formulating the adhesive composition.

A silane coupling agent also may be utilized in the adhesive composition of the present invention. In this embodiment, N-beta-aminoethyl-gamma-aminopropyltriethoxysilane coupling agent is added to one-part epoxy adhesive 140 in the range from about 0.75 PHR to about 1 PHR, or as a percentage from about 0.5 weight percent to about 1.5 weight percent of the total weight of adhesive; however, in alternate embodiments, the silane coupling agent may be up to about 3 PHR, or as a percentage up to about 2.5 weight percent of the total weight of adhesive. In still other embodiments, any of the other amine, mercaptan or epoxy type silane coupling agents also may be utilized. N-beta-(aminoethyl)-gamma-aminopropyltriethoxysilane, gamma-glycidoxypropyltrimethoxysilane, gamma-mercaptopropyltrimethoxysilane, beta-(3,4-epoxycyclohexyl)ethyltrimethoxysilane, and gamma-aminopropyltrimethoxysilane are just a few examples of the many silane coupling agents that may be utilized.

An exemplary composition of a one-part epoxy adhesive utilized in the present invention includes a resin having 100 PHR of a bisphenol F diglycidyl ether, 14.25 PHR of a solid cycloaliphatic amine primary curing agent, 7.5 PHR of an aromatic amine secondary curing agent, 0.75 PHR of aminopropyltriethoxysilane silane coupling agent, 0.75 PHR of a mercaptan silane coupling agent, and 10 PHR of a hollow glass spheres. In an alternate embodiment, a the composition of the adhesive utilized in the present invention includes 100 PHR of a bisphenol F diglycidyl ether; 14.25 PHR of a solid cycloaliphatic amine primary curing agent, 7.5 PHR of an aromatic amine secondary curing agent, 1 PHR of aminopropyltriethoxysilane silane coupling agent, 10 PHR of a hollow glass spheres acting as a filler, and 9.5 PHR of treated fumed silica as a thickener. These one-part adhesives, have low cure temperatures in the range from about 75° C. to about 100° C. In particular, after about 100 minutes at 85° C. the epoxy was fully cured as measured by differential scanning calorimetry (DSC). At 95° C. for 60 minutes the epoxy was determined to be fully cured. In alternate embodiments, cure temperatures up to about 140° C. also may be utilized with cure times as short as 3 minutes.

An alternate embodiment, of the present invention is shown in a cross-sectional view, in FIG. 2. In this embodiment, fluid ejection cartridge 200 includes fluid ejector head 202 where first adherend 220 is substrate carrier 222 and second adherend 230 is substrate 232. In this embodiment, substrate carrier 222 is a ceramic chip carrier, and substrate 232 is a silicon die. One component epoxy adhesive 240 forms bonded structure 206 having adhesive thickness 244 between opposing surface 236 of second adherend 230 and substrate receiving-surface 238 of first adherend 220. Adhesive bead 242 provides a method of attachment between silicon die 232 and ceramic chip carrier 222. In addition, adhesive bead 242 also provides a fluid seal between silicon die 232 and ceramic chip carrier 222. Ceramic chip carrier 222 includes fluid channel 224 providing fluidic coupling between fluid in a reservoir (See 362 in FIG. 3) and fluid inlet channel 234 formed in silicon die 232. In alternate embodiments, ceramic chip carrier 222 may be a multilayer ceramic chip carrier (MLC) having micro-fluidic paths or channels providing fluidic coupling to particular fluid ejectors 250, as well as, electrical traces formed in various layers in the MLC providing electrical interconnections to silicon die 232. Ceramic chip carrier 222 includes substrate carrier portion 226, which includes substrate receiving-surface 238.

In this embodiment, adhesive 240 is a thermally cured one-part epoxy, utilizing any of the compositions described above. Adhesive thickness 244 is in the range from about 400 micrometers to about 700 micrometers, in this embodiment. However, in alternate embodiments, adhesive thickness may be in the range from about 25 micrometers to 1000 micrometers depending on the particular application in which fluid ejector head 202 will be utilized. Further, in this embodiment, adhesive bead 242 is dispensed on ceramic chip carrier 222, and one-part adhesive 240 has a viscosity in the range from about 20,000 centipoise to about 500,000 centipoise measured at a high shear of about 15 revolutions per minute on the parallel plates of the rheometer. However, in alternate embodiments, one-part adhesive 240 also may have a viscosity in the range from about 7,000 centipoise to about 10,000 centipoise for those applications, such as when utilized as a moat-fill adhesive, where flow of the adhesive, after dispense, is desired. As noted above depending on the particular application adhesive bead 242 may be dispensed on silicon die 232 as well.

Silicon die 232 includes device surface 235 on which electronic components and electrical circuits are formed and opposing surface 236. In this embodiment, silicon die 232 is a silicon integrated circuit including transistors and other logic devices (not shown), however, any of the materials described above that support active and passive devices also may be utilized. In addition, silicon die 232 has fluid ejector actuators 250 formed on device surface 235. "Direct drive" structures also may be utilized in alternative embodiments. In a direct drive application each fluid ejector is electrically connected to a bond pad (not shown).

As shown in FIG. 2, in this embodiment, fluid ejector actuator 250 is a thermal resistor. In alternate embodiments, other energy generating elements such as piezoelectric, flextensional, acoustic, and electrostatic elements may be utilized. Chamber layer 252 is formed on device surface 235 of silicon die 232, and forms fluidic chamber 256 around fluid ejector actuator 250. When fluid ejector actuators 250 are activated fluid is ejected out of nozzles 258, which are generally located proximate to the fluid ejectors. Fluid inlet channel 234 is formed in silicon die 232, and extends from opposing surface 236 to device surface 235. Fluid inlet channel 234 provides a fluidic path for fluid to fill fluidic chamber 256. Nozzle layer 254 is formed over chamber layer 252. Nozzle layer 254 may be formed of similar materials as described above for the embodiment shown in FIG. 1.

In this embodiment, an energy impulse applied across the thermal resistor rapidly heats at least one component in the fluid above its boiling point causing vaporization of the fluid component resulting in an expanding bubble that ejects fluid drop 210 as shown in FIG. 2. Fluid drop 210 typically includes droplet head 212, drop-tail 214, and satellite-drops 215, which may be characterized as essentially a fluid drop. In such an embodiment, each activation of energy generating element 251 results in the ejection of a precise quantity of fluid in the form of essentially a fluid drop; thus, the number of times the fluid energy generating element is activated controls the number of drops 210 ejected from nozzle 258 (i.e. n activations results in essentially n fluid drops). Thus, fluid ejection cartridge 200 may generate deposits of discrete droplets of a fluid, including a solid material dissolved in one or more solvents or suspended or dispersed in the fluid, onto a discrete predetermined location on the surface of a receiving medium.

The drop volume of fluid drop 210 may be optimized by various parameters such as nozzle bore diameter, nozzle layer thickness, chamber dimensions, chamber layer thickness, energy generating element dimensions, and the fluid surface tension to name a few. Thus, the drop volume can be optimized for the particular fluid being ejected as well as the particular application in which fluid ejection cartridge 200 will be utilized. Fluid ejection cartridge 200, described in this embodiment, can reproducibly and reliably eject drops in the range of from about 5 femto-liters to about 900 pico-liters depending on the parameters and structures of the fluid ejector head as described above. In this embodiment, the term fluid may include any fluid material such as inks, adhesives, lubricants, chemical or biological reagents, as well as fluids containing dissolved or dispersed solids in one or more solvents.

Figure 3:
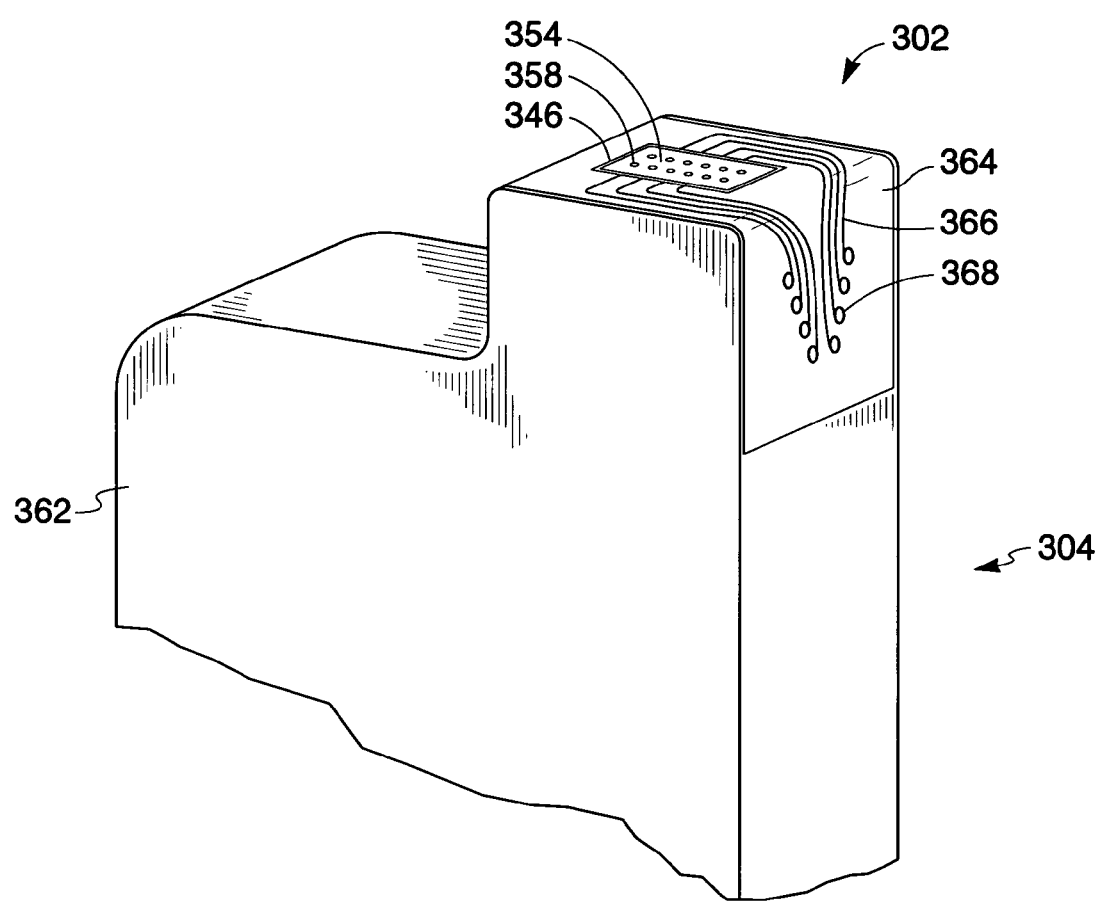
FIG. 3 is a perspective view of a portion of a fluid ejection cartridge according to an embodiment of the present invention.

Referring to FIG. 3, an alternate embodiment of the present invention is shown in a simplified perspective view. In this embodiment, fluid ejection cartridge 304 includes fluid reservoir 362 fluidically coupled to fluidic chambers (see, for example, FIGS. 1 and 2) in fluid ejector head 302. Nozzle layer 354 contains one or more nozzles 358 through which fluid is ejected. Ejector head 302 includes the substrate (not shown), nozzle layer 354, and nozzles 358.

In this embodiment, flexible circuit 364 is a polymer film and includes electrical traces 366 connected to electrical contacts 368. Electrical traces 366 are routed from electrical contacts 368 to bond pads on the silicon die or substrate (not shown) to provide electrical connection for the fluid ejection cartridge 304. Encapsulation beads 346 are dispensed along the edge of nozzle layer 354 and the edge of the substrate enclosing the end portion of electrical traces 366 and the bond pads on the substrate. In this embodiment, encapsulation beads 346 are formed using a one-part epoxy adhesive that includes the resin having a polyglycidyl ether of a polyhyrdric phenol, and the hardener having a cycloaliphatic polyamine. Depending on the particular application in which fluid ejection cartridge 304 may be utilized, any of the one-part epoxies described above may be used.

Figure 4:
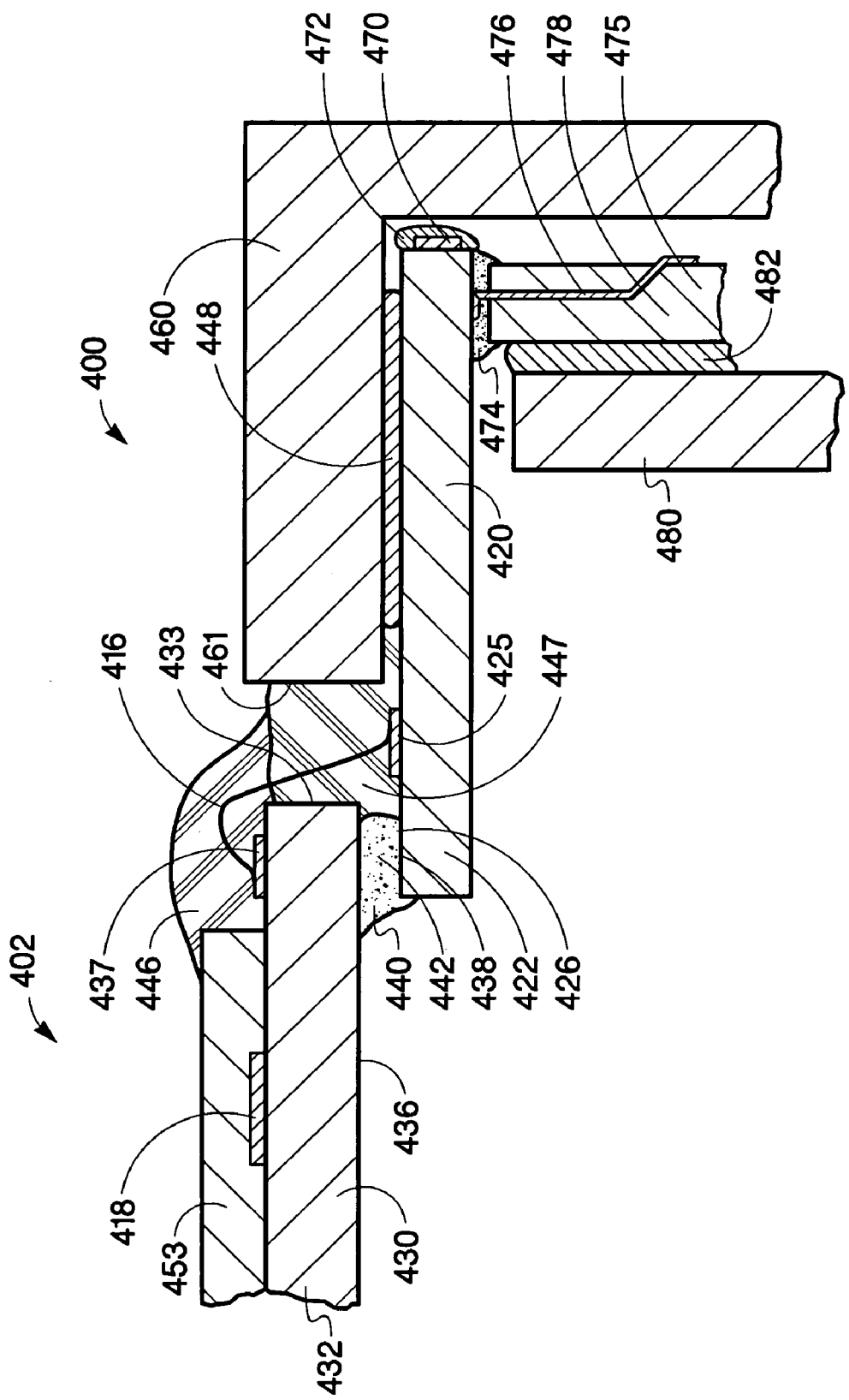
FIG. 4 is a cross-sectional view of a portion of a fluid ejection device according to an alternate embodiment of the present invention.

An alternate embodiment, illustrating alternative uses of a one-part epoxy adhesive of the present invention is shown in a cross-sectional view, in FIG. 4. In this embodiment, fluid ejection device 400 includes fluid ejector head 402 where first adherend 420 is substrate carrier 422 and second adherend 430 is substrate 432. In this embodiment, substrate carrier 422 is a multi-layer ceramic chip carrier (MLC), and substrate 432 is a silicon die. MLC 422 includes silicon die portion 426 which includes substrate receiving surface 438. One-part epoxy adhesive 440 forms adhesive bond 442 between the MLC and the substrate (i.e. between opposing surface 436 of second adherend 430 and substrate receiving-surface 438 of first adherend 420). One-part adhesive 440 also provides a fluid seal between silicon die 432 and multi-layer ceramic chip carrier 422. In this embodiment, active devices 418 and substrate bond pads 437 are disposed on substrate 432 and electrically coupled to each other and to fluid ejector actuators (not shown). However, alternate embodiments also may utilize substrates without active devices, such as a "direct drive" fluid ejector head where each fluid ejector actuator (not shown) is directly accessed by an individual electrical trace connected to a bond pad. Electrical interconnection 416 electrically couples substrate bond pad 437 to chip carrier bond pad 425 providing signal as well as power connections to fluid ejection device 400. Electrical interconnection 416, in this embodiment, is formed via wire bonding using lead wires formed from gold aluminum or alloys thereof. However, depending on the particular application of fluid ejection device 400, other interconnection schemes also may be utilized. For example, electrical interconnection 416 may be formed utilizing tape automated bonding (TAB). Another example is the use of a conductive adhesive or anisotropic conductive adhesive forming electrical interconnection 416. A solder bump for use in a ball grid array package is still another example.

In this embodiment, encapsulant 446 also may include a one-part epoxy utilizing any of the compositions described above or other polymeric material providing mechanical support, as well as, moisture and corrosion protection to electrical interconnections 416 and substrate bond pad 437. Encapsulant 446 and chamber orifice layer 453 also provide mechanical as well as moisture protection for electrical traces (not shown) and active devices 418. In this embodiment, chamber orifice layer 453 is utilized to form fluidic chambers (not shown), and orifices (not shown). In addition, moat-fill adhesive structure 447 also may include a one-part epoxy adhesive utilizing any of the compositions described above, and providing further mechanical, moisture and corrosion protection to electrical interconnections 416 and chip carrier bond pad 425. Moat-fill adhesive structure 447 essentially fills the volume formed by substrate edge surface 433, cover edge surface 461, substrate receiving-surface 438 of MLC 422, the edge of adhesive bond 442, and the edge of cover attach adhesive 448. Cover attach adhesive 448 forms an adhesive bond between a portion of cover 460 and a portion of MLC 422 providing further mechanical, moisture, and corrosion protection of fluid ejection device 400. Cover attach adhesive 448, in this embodiment, is an acrylic pressure sensitive adhesive; however, in alternate embodiments, other adhesives such as epoxies, urethanes, silicones, and rubber elastomeric adhesives also may be utilized.

As shown in FIG. 4, fluid ejection device 400 also includes semiconductor device 470 disposed on, and electrically coupled to, MLC 422 with glob top 472 providing encapsulation of the semiconductor device. In this embodiment, glob top 472 also may include a one-part epoxy adhesive utilizing any of the compositions described above, and providing further mechanical, moisture, and corrosion protection for semiconductor device 470. In this embodiment, semiconductor device 470 is an information storage element of any memory type device suitable for storing and outputting information that may be related to properties or parameters of either fluid ejection device 400 or the fluid being ejected or both. In addition, fluid ejection device 400 also includes electrical connector 475. Electrical connector 475 includes body 478 and connector electrical traces 476 disposed within body 478 providing electrical connection to MLC 422. Connector underfill 474 provides mechanical, moisture, and corrosion protection for the electrical connection between the electrical connector and the multi layer ceramic. In this embodiment, underfill 474 also may include a one-part epoxy adhesive utilizing any of the compositions described above. Further, in this embodiment, electrical connector attach adhesive 482 is utilized to attach electrical connector 475 to fluid ejection body portion 480. Electrical connector attach adhesive 482 also may include a one-part epoxy adhesive utilizing any of the compositions described above. In addition, in an alternate embodiment, one-part epoxy adhesive 440 also may form an adhesive bond between MLC 420 and fluid ejection body portion 480.

What is claimed is:

1. A fluid ejection device, comprising:
a substrate carrier having a substrate-receiving-surface;
a substrate having at least one fluid ejector actuator disposed on said substrate; and a viscous liquid one-part epoxy adhesive disposed between said substrate and said substrate-receiving-surface, wherein said viscous liquid one-part adhesive comprises:
an epoxy resin having a polyglycidyl ether of a polyhydric phenol, and
a solid cylcoaliphatic amine curing agent,
wherein said cycloaliphatic amine is 3-aminomethyl-3,5,5-trimethyl-1-cyclohexylamine.

2. The fluid ejection device in accordance with claim 1, wherein said viscous liquid one-part epoxy adhesive further comprises a liquid aromatic amine curing agent.

3. The fluid ejection device in accordance with claim 1, further comprising at least one nozzle proximate to said at least one fluid ejector actuator disposed over said substrate.

4. The fluid ejection device in accordance with claim 1, further comprising a reservoir fluidically coupled to said at least one fluid ejector actuator.

5. The fluid ejection device in accordance with claim 1, wherein said substrate carrier further comprises a ceramic chip carrier.

6. The fluid ejection device in accordance with claim 1, further comprising a reservoir fluidically coupled to said substrate.

7. The fluid ejection device in accordance with claim 1, wherein said fluid reservoir contains an ejectable fluid fluidically coupled to at least one nozzle.

8. The fluid ejection device in accordance with claim 1, further comprising:
a substrate bond pad disposed on said substrate; and
an electrical interconnection electrically coupled to said substrate bond pad, wherein said viscous liquid one-part epoxy adhesive encapsulates said substrate bond pad and said electrical interconnection.

9. The fluid ejection device in accordance with claim 1, further comprising a cover having a cover edge surface, and wherein said substrate further comprises a substrate edge surface, wherein said viscous liquid one-part epoxy adhesive forms a moat-fill adhesive structure in a volume formed between said substrate carrier, said substrate edge surface, and said cover edge surface.

10. The fluid ejection device in accordance with claim 1, wherein said polyglycidyl ether of a polyhydric phenol is a glycidyl ether of bisphenol A.

11. The fluid ejection device in accordance with claim 1, wherein said polyglycidyl ether of a polyhydric phenol is a glycidyl ether of bisphenol F.

12. The fluid ejection device in accordance with claim 1, wherein said epoxy resin further comprises a resin selected from the group consisting of a bisphenol type epoxy resin, an epoxy novolac resin, an epoxy phenolic novolac resin, a cresol glycidyl ether, a 1,4 cyclohexanedimenthanol digycidyl ether, an aliphatic glycidyl ether having C8 to C18 alkyl groups, an alkyl gylcidyl ether having C4 to C12 alkyl groups, a polypropylene glycol based resin, a 1,4 butanediol diglycidyl ether, triglycidylether of trimethylolpropane, 4-glycidoxy-N,N-diglycidyl aniline, halogenated phenoxy epoxy resins, epoxyalkoxy resins, and mixtures thereof.

13. The fluid ejection device in accordance with claim 1, wherein activation of said fluid ejector actuator ejects essentially a drop of a fluid from said at least one nozzle, wherein the volume of the fluid, of essentially said drop, is in the range of from about 5 femto-liters to about 900 pico-liters.

14. The fluid ejection device in accordance with claim 13, wherein said fluid ejector actuator is a thermal resistor.

15. The fluid ejection device in accordance with claim 13, wherein said fluid ejector actuator is a piezoelectric actuator.

16. The fluid ejection device in accordance with claim 13, wherein said fluid ejector actuator is a acoustic actuator.

17. The fluid ejection device in accordance with claim 1, further comprising a fluid definition layer.

18. The fluid ejection device in accordance with claim 17, wherein said fluid definition layer further comprises:
a chamber layer defining sidewalls of a chamber; and
an orifice layer defining a bore.

19. The fluid ejection device in accordance with claim 18, further comprising fluid inlet channels formed in said substrate and fluidically coupled to said chamber.

20. The fluid ejection device in accordance with claim 1, further comprising a device body coupled to said substrate carrier.

21. The fluid ejection device in accordance with claim 20, wherein said viscous liquid one-part epoxy adhesive forms an adhesive bond between said device body and said substrate carrier.

22. The fluid ejection device in accordance with claim 1, further comprising:
at least one active device disposed on said substrate; and
an electrical trace electrically coupling said at least one active device to said at least one fluid ejector actuator.

23. The fluid ejection device in accordance with claim 22, wherein said active device further comprises a transistor.

24. The fluid ejection device in accordance with claim 1, further comprising an electronic device electrically disposed on or within the fluid ejection device, wherein said viscous liquid one-part epoxy adhesive forms a glob top structure substantially encapsulating said electronic device.

25. The fluid ejection device in accordance with claim 24, wherein said electronic device further comprises a memory device, said memory device is adapted to electrically couple to a controller, and said memory device having at least one parameter of an ejectable fluid wherein said at least one parameter is communicable to said controller.

26. The fluid ejection device in accordance with claim 25, wherein said memory device further comprises at least one parameter of the fluid ejection device is communicable to said controller.

27. The fluid ejection device in accordance with claim 1, further comprising:
an electrical connector having:
a body, and
a connector electrical conductor; said electrical conductor electrically couples to a substrate carrier electrical conductor, wherein
said viscous liquid one-part epoxy adhesive forms an underfill adhesive structure between said substrate carrier and said electrical connector.

28. The fluid ejection device in accordance with claim 27, further comprising a fluid ejection body portion, wherein said one-part epoxy adhesive forms an electrical connector attach adhesive structure between said fluid ejection body portion and said electrical connector.

29. The fluid ejection device in accordance with claim 1, wherein said viscous liquid one-part adhesive further comprises a thixotrope.

30. The fluid ejection device in accordance with claim 29, wherein said thixotrope is selected from the group consisting of fumed silicas, clays, nanoclays, talcs, calcium carbonates, and mixtures thereof.

31. The fluid ejection device in accordance with claim 1, wherein said viscous liquid one-part adhesive further comprises a silane coupling agent.

32. The fluid ejection device in accordance with claim 31, wherein said silane coupling agent is in the range from about 0.5 weight percent to about 1.5 weight percent.

33. The fluid ejection device in accordance with claim 31, wherein said silane coupling agent is less than 2.5 weight percent.

34. The fluid ejection device in accordance with claim 1, wherein said one-part adhesive further comprises a filler.

35. The fluid ejection device in accordance with claim 34, wherein said filler is selected from the group consisting of glass spheres, low density glass spheres, ceramic spheres, polymer spheres, barium sulfate, barium titanate, silicon oxide powder, amorphous silica, talc, clay, mica powder, and mixtures thereof.

36. A fluid ejection device, comprising:
a substrate having means for ejecting a fluid;
means for supporting said substrate; and
means for adhering said substrate to said means for supporting said substrate, wherein said means for adhering includes a viscous liquid one-part epoxy adhesive having an epoxy resin including a polyglycidyl ether of a polyhydric phenol, and a solid cylcoaliphatic amine curing agent,
wherein said cylcoaliphatic amine is 3-aminomethyl-3,5,5-trimethyl-1-cyclohexylamine.

37. The fluid ejection device in accordance with claim 36, wherein said means for ejecting said fluid further comprises means for ejecting essentially a drop of said fluid, and the volume of said fluid is in the range of from about 5 femto-liters to about 900 pico-liters.

38. The fluid ejection device in accordance with claim 36, further comprising:
means for forming a chamber; and
means for forming a nozzle.

39. The fluid ejection device in accordance with claim 36, further comprising means for performing logic on said substrate.

* * * * *

UNITED STATES PATENT AND TRADEMARK OFFICE
CERTIFICATE OF CORRECTION

PATENT NO. : 7,566,122 B2
APPLICATION NO. : 10/825840
DATED : July 28, 2009
INVENTOR(S) : Lawrence E. Gibson et al.

It is certified that error appears in the above-identified patent and that said Letters Patent is hereby corrected as shown below:

In column 12, line 2, in Claim 16, before "acoustic" delete "a" and insert -- an --, therefor.

In column 12, line 54, in Claim 28, after "said" insert -- viscous liquid --.

In column 12, line 59, in Claim 29, after "one-part" insert -- epoxy --.

In column 12, line 64, in Claim 31, after "one-part" insert -- epoxy --.

In column 13, line 8, in Claim 34, delete "one-part adhesive" and insert -- viscous liquid one-part epoxy adhesive --, therefor.

In column 13, line 16, in Claim 36, after "fluid;" insert -- a substrate carrier having --.

Signed and Sealed this

Tenth Day of November, 2009

David J. Kappos
*Director of the United States Patent and Trademark Office*